(12) United States Patent
Kang et al.

(10) Patent No.: US 12,040,426 B2
(45) Date of Patent: Jul. 16, 2024

(54) MANUFACTURING PROCESS OF LIGHT EMITTING DEVICE COMPRISING QUANTUM DOT FILM AND TRANSPARENT ADHESIVE LAYER

(71) Applicant: Najing Technology Corporation Limited, Zhejiang (CN)

(72) Inventors: Yongyin Kang, Zhejiang (CN); Xiangpeng Du, Zhejiang (CN); Hailin Wang, Zhejiang (CN); Jianhai Zhou, Zhejiang (CN); Yunjian Lan, Zhejiang (CN)

(73) Assignee: Najing Technology Corporation Limited, Zhejiang (CN)

( * ) Notice: Subject to any disclaimer, the term of this patent is extended or adjusted under 35 U.S.C. 154(b) by 666 days.

(21) Appl. No.: 17/280,869

(22) PCT Filed: Sep. 20, 2019

(86) PCT No.: PCT/CN2019/107068
§ 371 (c)(1),
(2) Date: Mar. 26, 2021

(87) PCT Pub. No.: WO2020/063485
PCT Pub. Date: Apr. 2, 2020

(65) Prior Publication Data
US 2021/0408323 A1    Dec. 30, 2021

(30) Foreign Application Priority Data
Sep. 27, 2018 (CN) .......................... 201811138381.4

(51) Int. Cl.
*H01L 33/00* (2010.01)
*H01L 33/50* (2010.01)
(Continued)

(52) U.S. Cl.
CPC ........ *H01L 33/0093* (2020.05); *H01L 33/507* (2013.01); *H01L 33/56* (2013.01);
(Continued)

(58) Field of Classification Search
CPC ............... H01L 33/0093; H01L 33/641; H01L 2933/0041; H01L 33/502; H01L 33/507;
(Continued)

(56) References Cited

U.S. PATENT DOCUMENTS

| 2014/0021503 A1 | 1/2014 | Yoshida et al. |
| 2015/0028365 A1 | 1/2015 | Kurtin et al. |

(Continued)

FOREIGN PATENT DOCUMENTS

| CN | 103443941 A | 12/2013 |
| CN | 104910819 A | 9/2015 |

(Continued)

*Primary Examiner* — Didarul A Mazumder
(74) *Attorney, Agent, or Firm* — Samson G. Yu

(57) ABSTRACT

This present disclosure provides a manufacturing process of light emitting device and a light emitting device. The manufacturing process of light emitting device includes: step S1, making a quantum dot film; step S2, providing a LED unit, the LED unit including at least one LED chip; step S3, disposing a first transparent adhesive layer on an exposed surface of each LED chip; step S4, disposing the quantum dot film on the surface of the first transparent adhesive layer far away from the LED chip.

18 Claims, 3 Drawing Sheets

(51) Int. Cl.
*H01L 33/56* (2010.01)
*H01L 33/64* (2010.01)

(52) U.S. Cl.
CPC .... *H01L 33/641* (2013.01); *H01L 2933/0041* (2013.01); *H01L 2933/005* (2013.01)

(58) Field of Classification Search
CPC . H01L 33/644; H01L 33/56; H01L 2933/005; H01L 33/44; H01L 33/505; H01L 33/00–33/64; G05B 5/20–5/28; B32B 9/00
USPC .............................................. 257/79; 438/22
See application file for complete search history.

(56) References Cited

U.S. PATENT DOCUMENTS

| | | | |
|---|---|---|---|
| 2016/0351764 A1* | 12/2016 | Cha ........................ | H01L 33/505 |
| 2017/0321114 A1* | 11/2017 | Kamo ................... | C09D 201/00 |
| 2018/0040786 A1* | 2/2018 | Chen ..................... | H01L 33/505 |
| 2018/0072949 A1* | 3/2018 | Satake .................... | G02B 5/20 |

FOREIGN PATENT DOCUMENTS

| | | |
|---|---|---|
| CN | 106129229 A | 11/2016 |
| CN | 106449908 A | 2/2017 |
| CN | 106449943 A | 2/2017 |
| CN | 106486571 A | 3/2017 |
| CN | 206194789 U | 5/2017 |
| CN | 109545943 A | 3/2019 |
| IN | 106653985 A | 5/2017 |
| WO | 2015141226 A1 | 9/2015 |

\* cited by examiner

US 12,040,426 B2

MANUFACTURING PROCESS OF LIGHT EMITTING DEVICE COMPRISING QUANTUM DOT FILM AND TRANSPARENT ADHESIVE LAYER

This disclosure is a national application of PCT/CN2019/107068, filed on Sep. 20, 2019. The contents of PCT/CN2019/107068 are all hereby incorporated by reference. This disclosure takes the patent document named "MANUFACTURING PROCESS OF LIGHT EMITTING DEVICE AND LIGHT EMITTING DEVICE" filed on Sep. 27, 2018 with application number 201811138381.4 as the priority document, and the entire content is incorporated in this disclosure by reference.

TECHNICAL FIELD

This disclosure relates to the photoelectric field, in particular, to a manufacturing process of light emitting device and a light emitting device.

BACKGROUND

The combination of LED and light conversion materials enables white light to be used for lighting or display backlight modules. At present, a relatively mature implementation process is to disperse phosphor powder to silicone and dispose them on the LED chip for curing to achieve in-situ packaging. However, the humidity stability of quantum dots is not as good as that of phosphor powder, so a new process is needed to achieve in-situ packaging of quantum dot LED.

With reference to the scheme of phosphors, it is easy to think of dispersing quantum dots into adhesive and injecting them on the LED chip for curing and packaging. However, in actual production processes, due to equipment limitations, a plurality of LED chips need to be injected with quantum dot adhesive for multiple times. On the one hand, the process of injecting quantum dot adhesive for multiple times will cause the quantum dots to lose efficacy. On the other hand, the multi-layer stacking process can easily lead to uneven thickness after curing, which makes the quantum dot material unevenly distributed, thus leading to the uneven color coordinate between the same batch of the packages of quantum dot LED chips.

The aforesaid information disclosed in the background section is only used to enhance the understanding of the background art of the technique described in this article. Therefore, the background art may contain some information which is not formed in the prior art known to the country for those skilled in the art.

SUMMARY

According to one aspect of the present disclosure, there is provided a manufacturing process of light emitting device, the manufacturing process includes: step S1, making a quantum dot film; step S2, providing a LED unit, the LED unit including at least one LED chip; step S3, disposing a first transparent adhesive layer on an exposed surface of the LED chip; step S4, disposing the quantum dot film on a surface of the first transparent adhesive layer far away from the LED chip.

Optionally, the step S1 including: step S11, providing a substrate layer; step S12, disposing a first water-oxygen barrier layer on a surface of the substrate layer; step S13, disposing a light conversion layer on a surface of the first water-oxygen barrier layer far away from the substrate layer, and the light conversion layer including a quantum dot material; step S14, disposing a second water-oxygen barrier layer on a surface of the light conversion layer far away from the substrate layer; preferably, after the step S13, between the step S11 and the step S13, or a combination thereof, the step S1 further including: disposing a thermally conductive layer on at least one surface of the light conversion layer.

Optionally, the substrate layer is a peelable substrate layer.

Optionally, after the step S14, the step S1 further including: peeling off the substrate layer.

Optionally, the first transparent adhesive layer is in an uncured state, and after the step S4, the manufacturing process further including: curing the first transparent adhesive layer to realize the bonding between the quantum dot film and the first transparent adhesive layer, and preferably, a surface of the first transparent adhesive layer close to the quantum dot film is flat.

Optionally, the step S3 including: disposing a first transparent adhesive on an exposed surface of the LED chip; curing the first transparent adhesive to form the first transparent adhesive layer, preferably, disposing the quantum dot film on a surface of the first transparent adhesive layer by a binder.

Optionally, after the step S4, the manufacturing process further including: S5, disposing a second transparent adhesive layer on an exposed surface of the quantum dot film.

Optionally, the step S1 including: sectioning the quantum dot film into a plurality of quantum dot sub-films; the step S4 including: disposing each of the quantum dot sub-films on the surface of the first transparent adhesive layer far away from the LED chip, so that the projection of the quantum dot sub-film on a first plane covers the projection of the LED chip on the first plane with one-to-one correspondence, the first plane being a plane perpendicular to a thickness direction of the first transparent adhesive layer, preferably, the projection of each of the quantum dot sub-films on the first plane having the same size and shape as the projection of the correspondingly covered LED chip on the first plane.

Optionally, the LED unit further includes a substrate, and the LED chip is disposed on a surface of the substrate.

Optionally, sectioning the structure formed through the step S4 including the LED unit, the quantum dot film, and the first transparent adhesive layer.

According to another aspect of the present disclosure, there is provided a light emitting device, wherein the light emitting device including: a LED unit, including at least one LED chip; a first transparent adhesive layer, disposed on a surface of the LED chip; a quantum dot film, disposed on a surface of the first transparent adhesive layer far away from the LED chip.

Optionally, the quantum dot film includes a plurality of quantum dot sub-films, and the projection of the quantum dot sub-film on a first plane covers the projection of the LED chip on the first plane with one-to-one correspondence, and the first plane is a plane perpendicular to a thickness direction of the first transparent adhesive layer, preferably, the projection of each of the quantum dot sub-films on the first plane has the same size and shape as the projection of the correspondingly covered LED chip on the first plane.

Optionally, the quantum dot film includes: a light conversion layer, the light conversion layer including a quantum dot material; a thermally conductive layer, disposed on at least one surface of the light conversion layer; two water-oxygen barrier layers, disposed on two opposite surfaces of the light conversion layer, respectively as a first water-oxygen barrier layer and a second water-oxygen barrier layer.

Optionally, a material of the thermally conductive layer includes a thermally conductive material and a binder, and preferably, the thermally conductive material includes at least one of thermally conductive metal, glass powder, ceramic powder, graphite, and carbon powder, and more preferably, the thermally conductive material includes at least one of nano-copper and silver nanowire.

Optionally, the thermally conductive material includes the silver nanowire, the silver nanowire having a length of 10~500 μm and a diameter of 30 nm~20 μm.

Optionally, the water-oxygen barrier layer includes a water barrier layer and an oxygen barrier layer that are sequentially stacked, and the material of the water barrier layer includes at least one of epoxy resin, polyvinylidene chloride, polyvinylidene fluoride and nano-sized ZnO particles, and a material of the oxygen barrier layer includes at least one of polyvinyl alcohol, ethylene-vinyl alcohol copolymer and ethylene-vinyl acetate copolymer, wherein, the oxygen barrier layer is disposed on a side close to the light conversion layer.

Optionally, the light emitting device further includes: a second transparent adhesive layer, disposed on a surface of the quantum dot film far away from the first transparent adhesive layer.

According to another aspect of the present disclosure, there is provided a photoelectric device, wherein the photoelectric device includes any one of the aforesaid light emitting device.

BRIEF DESCRIPTION OF THE DRAWINGS

The accompanying drawings that constitute a part of this disclosure are used to provide a further understanding of this disclosure. The schematic embodiments and descriptions thereof of this disclosure are used to explain this disclosure and do not constitute an improper limitation of this disclosure. In the drawings.

Figure 1:
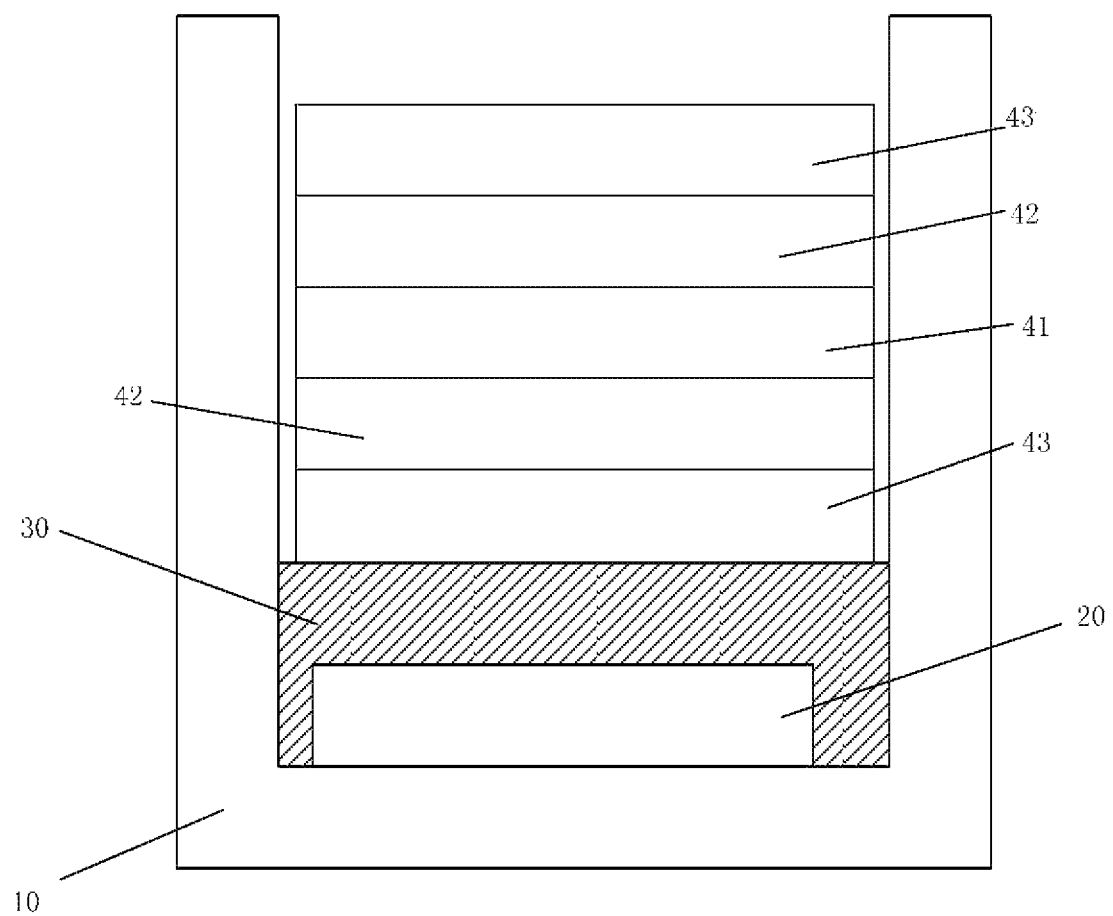
FIG. 1 shows a schematic diagram of a light emitting device according to some embodiments of this disclosure.

the aforesaid drawings include the following reference signs:

10, substrate; 20, LED chip; 30, first transparent adhesive layer; 40, quantum dot film; 400, quantum dot sub-film; 50, second transparent adhesive layer; 41, light conversion layer; 42, thermally conductive layer; 43, water-oxygen barrier layer.

DETAILED DESCRIPTION OF THE EMBODIMENTS

It should be noted that the embodiments of the present disclosure and the features of the embodiments may be combined with each other in case of no conflict. The disclosure will be described in detail below with reference to the figures and in conjunction with the embodiments.

It should be noted that the terms used herein are only for describing specific embodiments, and are not intended to limit the exemplary embodiments according to this disclosure. As used herein, unless otherwise expressly stated in the context, the singular form is also intended to include the plural form. In addition, it should also be understood that when the terms "comprising" and/or "including" are used in this specification, they indicate the presence of features, steps, operations, devices, components, and/or combinations thereof.

It should be understood that when an element (such as a layer, a film, a region, or a substrate) is described as being "on" another element, the element can be directly on the other element, or intervening elements may also be present. Moreover, in the specification and claims, when it is described that an element is "connected" to another element, the element can be "directly connected" to the other element, or "connected" to the other element through a third element.

As described in the background, the packaging process of quantum dot material in the prior art is difficult to make the quantum dot material uniformly distributed. In order to solve the above problem, this disclosure proposes a manufacturing process of light emitting device and a light emitting device.

In some typical embodiments of this disclosure, there is provided a manufacturing process of light emitting device, and the manufacturing process of light emitting device includes: step S1, making a quantum dot film 40; step S2, providing a LED unit, the aforesaid LED unit including at least one LED chip 20; step S3, disposing a first transparent adhesive layer 30 on the exposed surface of the aforesaid LED chip 20; step S4, disposing the aforesaid quantum dot film 40 on the surface of the aforesaid first transparent adhesive layer 30 far away from the aforesaid LED chip 20.

In the aforesaid manufacturing process of light emitting device, a quantum dot film is first made, so that the obtained light emitting device has a uniform distribution of quantum dot material, and then the distribution uniformity of the quantum dot material can be maintained in subsequent processes, thereby enabling uniform light emission of light emitting device. The quantum dot film is formed first, and the quantum dot film can also protect the quantum dots thereof in subsequent manufacturing processes of the light emitting device.

In some embodiments of this disclosure, the process of making the aforesaid quantum dot film 40 in the aforesaid step S1 includes: step S11, providing a substrate layer; step S12, disposing a first water-oxygen barrier layer on the surface of the aforesaid substrate layer; step S13, disposing a light conversion layer on the surface of the aforesaid first water-oxygen barrier layer far away from the aforesaid substrate layer, the aforesaid light conversion layer including quantum dot material; step S14, disposing a second water-oxygen barrier layer on the surface of the aforesaid light conversion layer far away from the aforesaid substrate layer.

In some embodiments, after the aforesaid step S13, between the aforesaid step S11 and the aforesaid step S13, or a combination thereof, the aforesaid step S1 further includes: disposing a thermally conductive layer on at least one surface of the aforesaid light conversion layer. Specifically, the number of thermally conductive layer can be one or two, and the two thermally conductive layers can be respectively disposed on the two surfaces of the light conversion layer. Certainly, disposing on the surface here does not necessarily mean disposing in contact with the light conversion layer.

Figure 3:
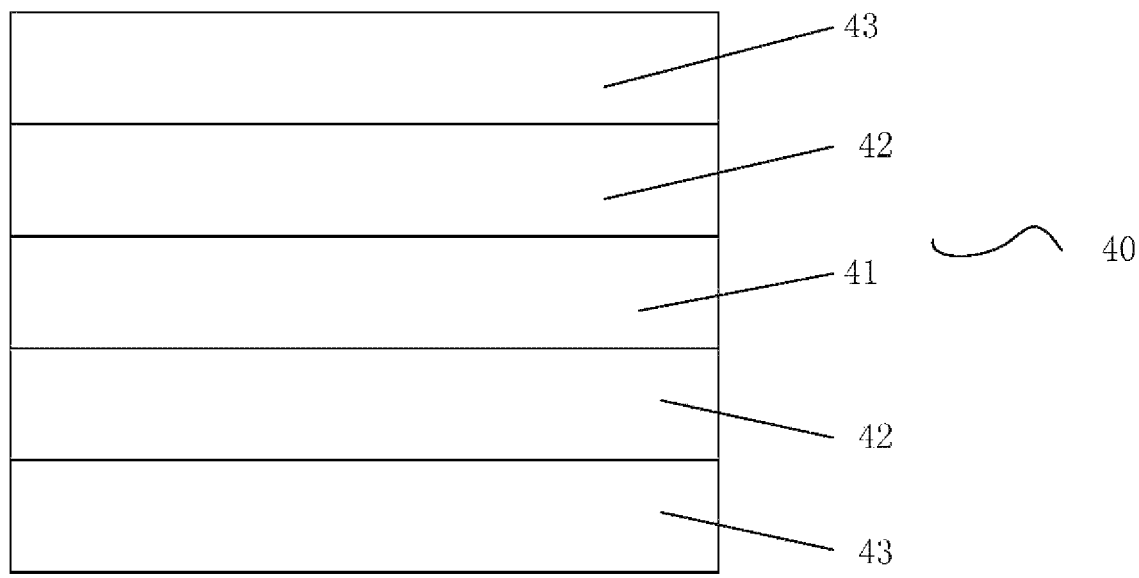
FIG. 3 shows a schematic structural diagram of a quantum dot film according to some embodiments of this disclosure.

In some embodiments, when disposing two thermally conductive layers, a water-oxygen barrier layer 43 (a first water-oxygen barrier layer) may be disposed between the substrate layer and thermally conductive layer 42, or may be disposed between the thermally conductive layer 42 and a light conversion layer 41, while another water-oxygen barrier layer 43 (a second water-oxygen barrier layer) can be disposed between the thermally conductive layer 42 and the light conversion layer 41, or can be disposed on the side of the thermally conductive layer 42 far away from the light conversion layer 41, with part of the structure shown in FIGS. 1 and 3.

The thermally conductive layer 42 can quickly discharge the heat radiated by the LED unit, and at the same time, combination with the water-oxygen barrier layer can better ensure the performance stability of the manufactured light emitting device and a longer lifespan. It should be noted that the sequence of the adjacent thermally conductive layer and water-oxygen barrier layer can be exchanged.

In some embodiments, the aforesaid substrate layer is a peelable substrate layer. In some embodiments, the peelable substrate layer is selected from a UV film, a red film or a release film. The LW film is peelable under LW light irradiation, and the red film is peelable under heating. In some embodiments, the peelable substrate layer may be disposed on both sides of the light conversion layer, and the peelable substrate layer may be used to protect the appearance of the quantum dot film.

In some embodiments, the manufacturing process of the scheme involving two peelable substrate layers includes: dispersing quantum dots in an adhesive to obtain a quantum dot adhesive, and disposing the quantum dot adhesive on the peelable substrate layer to form a quantum dot adhesive layer, and another substrate layer is disposed on the quantum dot adhesive layer and then cured.

In some embodiments, after the aforesaid step S14, the aforesaid step S1 further includes: peeling off the aforesaid substrate layer. The purpose of peeling off the peelable substrate layer is to reduce the thickness of the quantum dot film. Under the trend of thinner electronic products, the overall thickness of the light emitting device also needs to be reduced, and the stability of the quantum dot film also needs to be considered in case of the reduction of the thickness of the quantum dot film, therefore, it is very difficult to reduce the thickness of the quantum dot film. For example, when the traditional PET is used as the substrate layer, the thickness of PET can be reduced, but when the ultra-thin PET is used as the substrate, its stiffness is not enough, which will easily lead to poor thickness uniformity of the manufactured quantum dot film and affect uniform light emission. The application of the peelable substrate layer can simultaneously improve the stability of the quantum dot film and realize the advantages of an ultra-thin quantum dot film.

In some embodiments, the quantum dot material in the light conversion layer includes a CdSe core as well as a $Cd_xZn_{(1-x)}Se$ shell, a $ZnSe_zS_{(1-z)}$ shell, a $Cd_yZn_{(1-y)}S$ shell and a ZnS shell that are successively coated outside of the CdSe core from the inside to the outside, where $0<x<1$, $0<y<1$, $0<z\leq1$. The band gap of shell materials of the core-shell quantum dot is broader and broader with a small lattice mismatch degree between layers, the alloy shell having uniform composition, the core-shell quantum dot having good monodispersity in size and morphology, narrow full width at half maximum of photoluminescence, high photoluminescence quantum yield and high stability, and the whole synthesis process is simple, with few influencing factors and good repeatability. The preparation of the core-shell quantum dot may include the following steps: S1, providing CdSe core quantum dots; S2, adding the aforesaid CdSe core quantum dots to a first zinc precursor solution, and then adding a mixed solution of a first cadmium precursor and a first selenium precursor so as to coat a $Cd_xZn_{(1-x)}Se$ shell outside of the aforesaid CdSe core quantum dot, where $0<x<1$; S3, and then adding a second selenium precursor to the solution after the reaction in step S2, so as to coat a ZnSe shell outside of the aforesaid $Cd_xZn_{(1-x)}Se$ shell, purifying to obtain a core-shell quantum dot intermediate; or, adding a mixed solution of a second selenium precursor and a first sulfur precursor (or adding the second selenium precursor and the first sulfur precursor at the same time without mixing) to the solution after the reaction in step S2, so as to coat a $ZnSe_zS_{(1-z)}$ shell outside the aforesaid $Cd_xZn_{(1-x)}Se$ shell, where $0<z<1$, purifying to obtain a core-shell quantum dot intermediate; or, successively adding a second selenium precursor and a first sulfur precursor to the solution after the reaction in step S2, so as to successively coat a ZnSe shell and a $ZnSe_pS_{(1-p)}$ shell outside the aforesaid $Cd_xZn_{(1-x)}Se$ shell, where $0<p<1$, purifying to obtaining a core-shell quantum dot intermediate; S4, adding the aforesaid purified core-shell quantum dot intermediate to a second zinc precursor solution, and then adding a mixed solution of a second cadmium precursor and a second sulfur precursor, so as to coat a $Cd_yZn_{(1-y)}S$ shell outside of the aforesaid core-shell quantum dot intermediate, where $0<y<1$; S5, adding a third sulfur precursor to the solution after the reaction in step S4, so as to coat a ZnS shell outside the aforesaid $Cd_yZn_{(1-y)}S$ shell. The quantum dots with this structure can improve the stability of the quantum dot film.

In some other embodiments, in the preparation method of the core-shell quantum dot, the mixed solution of a first cadmium precursor and a first selenium precursor is added dropwise to the solution, and the mixed solution of a second cadmium precursor and a second sulfur precursor is added dropwise to the solution. The dropping method can improve the monodispersity in size and morphology of the quantum dots and enhance photoluminescence quantum yield.

In some embodiments, when $z=1$ in the $ZnSe_zS_{(1-z)}$ shell, the core-shell quantum dot further includes a $ZnSe_pS_{(1-p)}$ shell between a $ZnSe_zS_{(1-z)}$ shell and a $Cd_yZn_{(1-y)}S$ shell, where $0<p<1$.

In some embodiments, the prepared light conversion layer contains 0.5~6 amounts by weight of red quantum dots, 0.8~9 amounts by weight of green quantum dots, 0.1~8 amounts by weight of diffusion particles, and 77~98.6 amounts by weight of polymer resin. The red quantum dots have a wavelength range of 615~640 nm and a full width at half maximum of less than 40 nm; the green quantum dots have a wavelength range of 515~540 nm and a full width at half maximum of less than 40 nm; the diffusion particles can be at least one of inorganic particles with a particle size of 200 nm~400 nm and polymer particles with a particle size of 1~5 μm, and the diffusion particles are selected from one or more of titanium oxide, zirconium oxide, silicon oxide, aluminum oxide, silicone particles, PS, PC, and PMMA particles.

In some embodiments, the material of the aforesaid thermally conductive layer includes a thermally conductive material and a binder, so that the thermally conductive layer can be directly bonded to the light conversion layer. Generally, the higher the thermal conductivity of the thermally conductive material, the better, but light transmittance shall also be considered. The aforesaid thermally conductive material includes at least one of thermally conductive metal, glass powder, ceramic powder, graphite and carbon powder. In another embodiment, the aforesaid thermally conductive material includes at least one of nano-copper and silver nanowire. These two materials provide better heat conduction and light transmittance.

In order to better conduct heat without affecting the optical performance of the quantum dot film, in some embodiments, the weight percentage of the thermally conductive material in the material of the thermally conductive layer is 0.01~20%, preferably 0.1~2%.

In some other embodiments of this disclosure, the aforesaid thermally conductive material includes the aforesaid silver nanowire, and the aforesaid silver nanowire has a length of 10~500 μm and a diameter of 30 nm~20 μm. This can further ensure that a better thermally conductive effect is obtained without affecting the luminous efficiency.

In some embodiments, the binder in the thermally conductive layer has a visible light transmittance of more than or equal to 80%, with good thermal stability and light resistance. In a specific embodiment, the aforesaid binder is selected from at least one of silicone, acrylate, polyurethane, and epoxy. In some embodiments, the refractive index of the aforesaid binder is between 1.4 and 1.65, which can further ensure that the thermally conductive layer does not affect the optical performance of the light emitting device and can increase the light output.

In some embodiments, the aforesaid water-oxygen barrier layer may be formed of organic materials, or may be formed of both inorganic materials and organic materials. In some embodiments, the water-oxygen barrier layer formed of organic materials may be either a multilayer combination of an oxygen barrier layer and a water barrier layer, or a single water-oxygen barrier layer. In some embodiments, the inorganic material may be selected from at least one of silicon-oxygen compound, aluminum-oxygen compound, and silicon-nitrogen compound. These inorganic materials may be deposited on at least one surface of the light conversion layer by magnetron sputtering, atomic layer deposition, or chemical vapor deposition.

In some embodiments, when the aforesaid water-oxygen barrier layer is only formed of organic materials, the aforesaid water-oxygen barrier layer includes a water barrier layer and an oxygen barrier layer that are sequentially stacked, and the material of the aforesaid water barrier layer includes at least one of epoxy resin, polyvinylidene chloride, polyvinylidene fluoride and nano-sized ZnO particles, while the material of the aforesaid oxygen barrier layer includes at least one of polyvinyl alcohol, ethylene-vinyl alcohol copolymer and ethylene-vinyl acetate copolymer. Such a water-oxygen barrier layer has the advantages of simple manufacturing process, low cost, high production efficiency and no need to buy expensive magnetron sputtering or chemical deposition equipment.

In some embodiments, the light conversion layer includes a quantum dot material, and further includes phosphors. In some embodiments, the aforesaid light conversion layer includes red quantum dot material and green quantum dot material, or includes red quantum dot material and green fluorescent material, or includes red fluorescent material and green quantum dot material, or includes only red quantum dots or green quantum dots.

In some embodiments, the aforesaid light conversion layer may be one layer or multiple layers, for example, two layers including one red light conversion layer and the other green light conversion layer, wherein at least one light conversion layer includes quantum dots. The adhesive of the light conversion layer can be selected from acrylic acid and acrylate polymers compatible with quantum dots, or other suitable materials.

In some embodiments, the thickness of the light conversion layer may range from 5 to 50 μm, preferably 10 to 30 μm, and the total thickness of the quantum dot film is 50~300 μm, preferably 100~200 μm.

In some embodiments, the process of disposing the aforesaid first transparent adhesive layer 30 on the exposed surface of the aforesaid LED chip 20 includes: disposing a first transparent adhesive on the surface of each LED chip 20; curing the aforesaid first transparent adhesive; and planarizing the aforesaid cured first transparent adhesive to form the aforesaid first transparent adhesive layer 30. When the first transparent adhesive layer 30 is in a cured state, in order to more firmly bond the quantum dot film 40 on the surface of the first transparent adhesive layer 30, in some embodiments of this disclosure, the quantum dot film 40 is disposed on the surface of the aforesaid first transparent adhesive layer 30 by a binder.

In some embodiments, the aforesaid first transparent adhesive layer contains a thermally conductive material thereby improving the thermal conductivity of the light emitting device.

Figure 2:
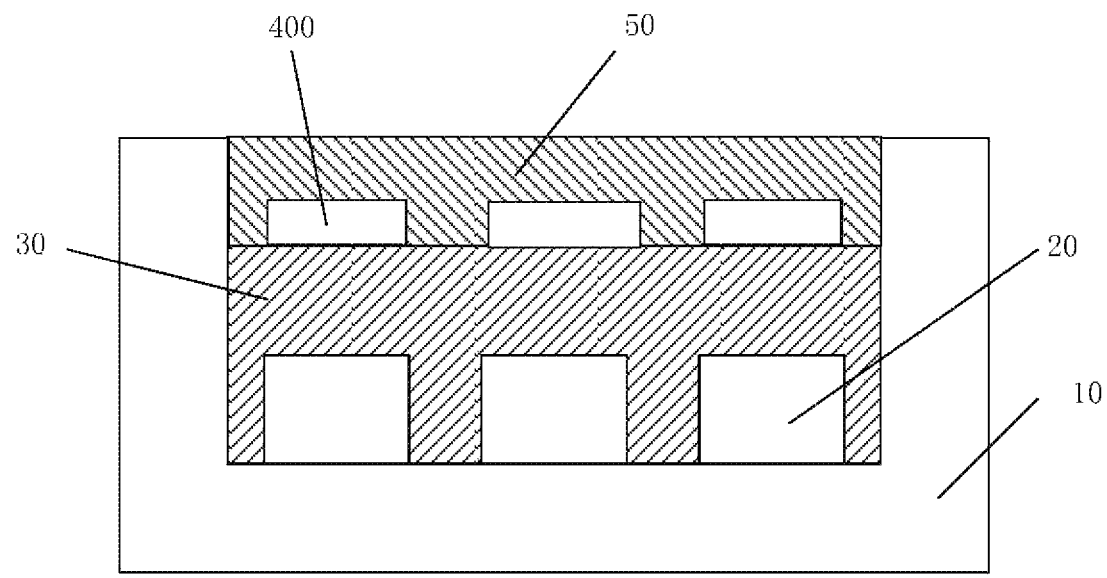
FIG. 2 shows a schematic diagram of another light emitting device according to some embodiments of this disclosure.

In some embodiments, the quantum dot film 40 of this disclosure may be a whole layer, covering one LED chip 20, as shown in FIG. 1. In some other embodiments, the quantum dot film 40 may be a plurality of spaced quantum dot sub-films 400, with each of quantum dot sub-films 400 correspondingly covering one LED chip 20, as shown in FIG. 2.

The aforesaid "covering" means that the projection of the quantum dot film or quantum dot sub-film on the first plane can cover the projection of the LED chip on the first plane.

Compared with the embodiments in which a whole quantum dot film 40 is disposed on a plurality of LED chips, in order to increase the utilization rate of the quantum dot film 40 and reduce light loss, in some preferred embodiments, the aforesaid step S1 includes: sectioning the aforesaid quantum dot film 40 into a plurality of quantum dot sub-films 400; the aforesaid step S4 includes: disposing each of the aforesaid quantum dot sub-films 400 on the surface of the aforesaid first transparent adhesive layer 30 far away from the aforesaid LED chip 20, so that the projection of the aforesaid quantum dot sub-film 400 on a first plane covers the projection of the aforesaid LED chip 20 on the aforesaid first plane with one-to-one correspondence, the aforesaid first plane being a plane perpendicular to the thickness direction of the aforesaid first transparent adhesive layer 30.

In some embodiments, the quantum dot sub-film can be transferred to the first transparent adhesive layer by adsorption and corresponds to each LED.

In a specific embodiment, the projection of each of the aforesaid quantum dot sub-films 400 on the aforesaid first plane has the same size and shape as the projection of the aforesaid correspondingly covered LED chip 20 on the aforesaid first plane. As shown in FIG. 2, the projection of the quantum dot sub-film and the projection of the corresponding LED chip have the same size and shape, which can better ensure the coverage of the corresponding LED chip by the quantum dot sub-film.

In some other embodiments of this disclosure, the first transparent adhesive layer in step S3 is in an uncured state; in step S4: curing the first transparent adhesive layer to realize the bonding between the quantum dot film and the first transparent adhesive layer, after disposing the quantum dot film on the surface of the first transparent adhesive layer far away from each LED chip. Preferably, the surface of the first transparent adhesive layer close to the quantum dot film is flat, so as to better achieve light-emitting uniformity.

In order to better protect the quantum dot film, in some embodiments of this disclosure, after the aforesaid quantum dot film is disposed on the surface of the aforesaid first transparent adhesive layer far away from each LED chip, the aforesaid manufacturing process further includes: disposing a second transparent adhesive layer 50 on the exposed surface of the aforesaid quantum dot film 40, forming a structure shown in FIG. 2 in one embodiment.

In some embodiments, the surface of the aforesaid second transparent adhesive layer 50 far away from the aforesaid quantum dot film 40 is flat or convex. Of course, the surface of the second transparent adhesive layer 50 far away from the quantum dot film 40 is not limited to being flat or convex. In some specific circumstances, those skilled in the art can also arrange it as uneven surface to increase the light output.

In some embodiments, a lens is disposed above the aforesaid quantum dot film 40 to increase the light output.

In order to meet the thinner and lighter design requirements of the formed light emitting device, in some embodiments of this disclosure, the thickness of the aforesaid first transparent adhesive layer and the aforesaid second transparent adhesive layer are independently between 5 and 100 μm, or the total thickness of the aforesaid first transparent adhesive layer and the aforesaid second transparent adhesive layer is between 5 and 100 μm.

In some embodiments, the materials of the first transparent adhesive layer and the second transparent adhesive layer in this disclosure can be independently selected from at least one of modified silicone, acrylic acid, polyvinyl alcohol, and epoxy resin, and the two layers can be the same or different. Certainly, the material of the first transparent adhesive layer and the material of the second transparent adhesive layer in this disclosure can be other materials, such as polymers with high water-oxygen barrier property or high temperature resistance. The aforesaid "transparent" means that the adhesive layer can transmit light. According to different performance requirements, the transparent adhesive layer may contain non-transmittable materials such as scattered particles.

In some embodiments, the raw materials for preparing at least one of the first transparent adhesive layer and the second transparent adhesive layer include materials with high thermal conductivity.

The LED unit of this disclosure may include a substrate, such as a PCB substrate, or may not include a PCB substrate. Those skilled in the art can choose to dispose a substrate or no substrate in the LED unit according to the actual situation. When providing the substrate, the LED chip is disposed on the surface of the substrate.

In some other embodiments of this disclosure, the quantum dot film is not sectioned, but the structure formed through the aforesaid step S4 including the LED unit, the quantum dot film, and the first transparent adhesive layer is sectioned. For the formation of small light emitting devices, the process is very simple by eliminating the step of cutting large quantum dot film into small quantum dot films and attaching them to corresponding LED chips, thereby enhancing production efficiency by concurrent sectioning of them and the LED unit.

In some embodiments, the LED unit includes a LED wafer, and the size and shape of the manufactured quantum dot film are as same as or similar to the size and shape of the LED wafer. The size of the sectioned light emitting device can be cut into various sizes according to specific needs.

In some other exemplary embodiments of this disclosure, there is provided a light emitting device. As shown in FIG. 1, the structure of the aforesaid light emitting device includes a LED unit, a first transparent adhesive layer 30 and a quantum dot film 40, and the aforesaid LED unit includes at least one LED chip 20; the first transparent adhesive layer 30 is disposed on the surface of each LED chip; the quantum dot film 40 is disposed on the surface of the first transparent adhesive layer 30 far away from the aforesaid LED chip.

The light emitting device shown in FIG. 1 also includes a substrate 10, and at least one LED chip is disposed on the surface of the aforesaid substrate 10.

In some embodiments, in the aforesaid light emitting device, the quantum dot film is fixed above the LED chip through the first transparent adhesive layer, the first transparent adhesive layer having a certain adhesive force, so that the formed quantum dot film can be disposed above the LED chip through the first transparent adhesive layer, which avoids the problem of uneven distribution of quantum dots caused by directly injecting quantum dot material onto the LED chips for multiple times for curing in the prior art. The quantum dot material in the quantum dot film is distributed uniformly, thus enabling uniform light emission of light emitting device.

In some embodiments, both the upper and lower surfaces of the quantum dot film are flat, and the quantum dot film is flatly disposed on the first transparent adhesive layer.

In some embodiments, the quantum dot film of this disclosure may be a whole layer covering one LED chip or a plurality of LED chips at the same time, or may be a plurality of spaced quantum dot sub-films, with each of quantum dot sub-films correspondingly covering one LED chip.

In order to increase the utilization rate of the quantum dot film and reduce light loss, in some embodiments of this disclosure, the aforesaid quantum dot film 40 includes a plurality of quantum dot sub-films 400. As shown in FIG. 2, the projection of the aforesaid quantum dot sub-film 400 on a first plane covers the projection of the aforesaid LED chip on the aforesaid first plane with one-to-one correspondence, the aforesaid first plane being a plane perpendicular to the thickness direction of the aforesaid first transparent adhesive layer.

In some other embodiments of this disclosure, as shown in FIGS. 1 and 3, the aforesaid quantum dot film 40 includes a light conversion layer 41, a thermally conductive layer 42, and two water-oxygen barrier layers 43, and the aforesaid light conversion layer 41 includes a quantum dot material; the thermally conductive layer 42 is disposed on at least one surface of the aforesaid light conversion layer 41; two water-oxygen barrier layers 43, respectively as a first water-oxygen barrier layer and a second water-oxygen barrier layer, are disposed on the two opposite surfaces of the aforesaid light conversion layer. The thermally conductive layer 42 can quickly discharge the heat emitted by the LED unit, which can better ensure the performance stability of the manufactured light emitting structure and a longer lifespan. The water-oxygen barrier layer can block the intrusion of water vapor and oxygen into the light conversion layer, ensuring the performance stability of the light conversion layer and a long lifespan.

The material of the aforesaid thermally conductive layer includes a thermally conductive material and a binder, so that the thermally conductive layer can be directly bonded to the light conversion layer, thereby ensuring a small thickness of the formed light emitting device and meeting the requirement of a lightweight structure.

The aforesaid thermally conductive material can be any material that can conduct heat in the prior art, and those skilled in the art can select a suitable thermally conductive material according to the actual situation to form the thermally conductive layer of this disclosure.

In order to make the thermally conductive layer have better thermal conductivity, in some embodiments of this disclosure, the aforesaid thermally conductive material includes at least one of thermally conductive metal, glass powder, ceramic powder, graphite, and carbon powder.

In some embodiments of this disclosure, the aforesaid thermally conductive material includes at least one of nano-copper and silver nanowire. These two materials provide better heat conduction.

In some embodiments of this disclosure, the aforesaid thermally conductive material includes the aforesaid silver nanowire, and the aforesaid silver nanowire has a length of 10~500 µm and a diameter of 30 nm~20 µm. This can further ensure that a better thermally conductive effect is obtained without affecting the luminous efficiency.

In some embodiments, the aforesaid water-oxygen barrier layer may be formed of organic materials, or may be formed of both inorganic materials and organic materials. The inorganic material may be selected from at least one of silicon-oxygen compound, aluminum-oxygen compound, and silicon-nitrogen compound. These inorganic materials may be deposited on at least one surface of the light conversion layer by magnetron sputtering, atomic layer deposition, or chemical vapor deposition.

In some other embodiments of this disclosure, when the aforesaid water-oxygen barrier layer is only formed of organic materials, the aforesaid water-oxygen barrier layer includes a water barrier layer and an oxygen barrier layer that are sequentially stacked, and the material of the aforesaid water barrier layer includes at least one of epoxy resin, polyvinylidene chloride, polyvinylidene fluoride and nano-sized ZnO particles, while the material of the aforesaid oxygen barrier layer includes at least one of polyvinyl alcohol, ethylene-vinyl alcohol copolymer and ethylene-vinyl acetate copolymer. The oxygen barrier layer is disposed on the side close to the light conversion layer. Such water-oxygen barrier layer has the advantages of low manufacturing cost and high production efficiency and no need to buy expensive magnetron sputtering or chemical deposition equipment.

In some embodiments, the light conversion layer of this disclosure includes quantum dot material, and may further include phosphors. Specifically, the aforesaid light conversion layer may include red quantum dot material and green quantum dot material, or may include red quantum dot material and green fluorescent material, or may include red fluorescent material and green quantum dot material, or may include only red quantum dots or green quantum dots.

Figure 4:
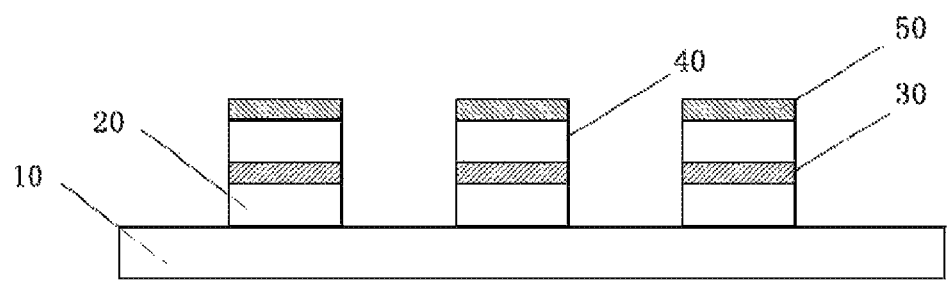
FIG. 4 shows a schematic structural diagram of some embodiments of this disclosure.

In some embodiments, the aforesaid light conversion layer may be one layer or multiple layers, for example, two layers as shown in FIG. 4 including one red light conversion layer and the other green light conversion layer, wherein at least one light conversion layer includes quantum dots.

In order to better protect the quantum dot film, in some embodiments of this disclosure, as shown in FIG. 2, the aforesaid light emitting device further includes a second transparent adhesive layer 50, and the second transparent adhesive layer 50 is disposed on the surface of the aforesaid quantum dot film 40 far away from the first transparent adhesive layer 30. In some embodiments, the surface of the aforesaid second transparent adhesive layer 50 far away from the aforesaid quantum dot film 40 is flat or convex.

It should be noted that the substrate for the LED in this disclosure can be a simple plate structure, or a structure with mounting grooves shown in FIGS. 1 and 2. Those skilled in the art can provide a substrate with suitable structure according to the actual situation to place the LED chip. The substrate of the LED unit may be a component of the light emitting device or a substrate temporarily used in the manufacturing process that does not constitute a component of the light emitting device. The circuits between the LED chips can be connected in series or independently controlled.

In some specific embodiments of this disclosure, the LED chip is a blue-emissive LED chip. Surely, the LED chip in this disclosure is not limited to the blue-emissive LED chip, but can also be a LED chip that emit other light.

It should be noted that there may be one or more quantum dot films or may be one or more types of quantum dot film disposed in the light emitting device of this disclosure, depending on the actual situation. When the light conversion layer includes only a light conversion material corresponding to one color, multiple quantum dot films can be provided, and the light conversion layer in each quantum dot film includes quantum dot materials corresponding to different colors to emit white light. For example, when the LED chip is a blue-emissive LED chip, two quantum dot films consisting of a green-light quantum dot film and a red-light quantum dot film can be provided. When sectioning into quantum dot sub-films, the two quantum dot films are both sectioned.

According to another aspect of this disclosure, there is provided a photoelectric device, which includes any one of the aforesaid light emitting device. The photoelectric device may be a lighting device, a display device, a detection device, etc.

In order to enable those skilled in the art to understand the technical solution of this disclosure more clearly, the following will be described in conjunction with specific embodiments.

The red quantum dot material and the green quantum dot material in the embodiments were prepared by the following methods.

Preparation of Red Quantum Dot Material:

Synthesis of spherical CdSe quantum dots (size: 3.7 nm) with a first exciton absorption peak of 570 nm: CdO (0.0256 g, 0.2 mmol), HSt (0.1420 g, 0.5 mmol) and ODE (4 mL) were placed in a 25 mL three-necked flask, stirred and purged with argon for 10 minutes, then heated to 280° C. to obtain a clear solution, and then cooled to 250° C.; 1 mL of selenium powder suspension with a concentration of 0.1 mmol/mL was quickly injected into the three-necked flask, and the reaction temperature was controlled at 250° C.; after reacting for 7 minutes, 0.05 mL of 0.1 mmol/mL selenium powder suspension was quickly injected every 2 to 3 minutes until the quantum dot size reaches the target size, then the reaction was immediately stopped heating; during the process, a certain amount of reaction solution was taken and injected into a quartz cuvette containing 1 to 2 mL of toluene for the measurement of UV-visible absorption spectrum and photoluminescence spectrum.

Synthesis of CdSe/CdZnSe/ZnSe/CdZnS/ZnS core-shell quantum dots (emission peak wavelength: 630 nm):

4 mmol zinc acetate, 0.15 mmol cadmium acetate, 4.4 g oleic acid, and 10 mL ODE were placed in a 100 mL three-necked flask, and purged with inert gas for 30 minutes at 200° C. The purified CdSe quantum dot solution with an absorbance of 50 at the first exciton absorption peak was injected, and the temperature was raised to 310° C.; 1 mL of 0.5 mmol/mL Se-TOP solution was injected for 10 minutes of reaction, then 0.1 mL of 2 mmol/mL Se-TBP solution was injected for 10 minutes of reaction, then the reaction was stopped, and CdSe/CdZnSe/ZnSe core-shell quantum dots were obtained, purified and dissolved in 1 mL ODE after the temperature was reduced to room temperature.

0.66 g basic zinc carbonate (1.2 mmol), 2.8 g oleic acid, and 5 g ODE were weighed and placed in a 100 mL three-necked flask, purged with inert gas for 30 minutes, and then heated to 280° C. to obtain a clear solution. The purified CdSe/CdZnSe/ZnSe core-shell quantum dots were injected, the temperature was raised to 300° C., and a mixed solution of 2 mL of 0.5 mmol/mL S-TBP and 0.05 mL of 0.2 mmol/mL cadmium oleate were dropwise added at a rate of 5 mL/h. Then, 2 mL of 0.5 mmol/mL S-TBP solution was dropwise added at the same rate, and the reaction was stopped after the addition was complete.

Preparation of Green Quantum Dot Material:

Synthesis of spherical CdSe quantum dots (size: 3.7 nm) with a first exciton absorption peak of 480 nm: CdO (0.0128 g, 0.1 mmol), HSt (0.1420 g, 0.5 mmol) and ODE (4 mL) were placed in a 25 mL three-necked flask, stirred and purged with argon for 10 minutes, then heated to 280° C. to obtain a clear solution, and then cooled to 250° C. 1 mL of selenium powder suspension with a concentration of 0.05 mmol/mL was quickly injected into the three-necked flask, and the reaction temperature was controlled at 220° C. After reacting for 5 minutes, the three-necked flask was immediately stopped heating. During the process, a certain amount of reaction solution was taken and injected into a quartz cuvette containing 1 to 2 mL of toluene for the measurement of UV-visible absorption spectrum and fluorescence spectrum.

Synthesis of CdSe/CdZnSe/ZnSe/CdZnS/ZnS Core-Shell Quantum Dots (Emission Peak Wavelength: 530 nm):

4 mmol zinc acetate, 0.05 mmol cadmium acetate, 4.4 g oleic acid, and 10 mL ODE were placed in a 100 mL three-necked flask, and purged with inert gas for 30 minutes at 200° C. The purified CdSe quantum dot solution with an absorbance of 50 at the first exciton absorption peak was injected, and the temperature was raised to 300° C. 1 mL of 0.5 mmol/mL Se-TOP solution was injected for 10 minutes of reaction, then 0.2 mL of 2 mmol/mL Se-TBP solution was injected for 10 minutes of reaction, then the reaction was stopped, and CdSe/CdZnSe/ZnSe core-shell quantum dots were obtained, purified and dissolved in 1 mL ODE after the temperature was reduced to room temperature.

0.66 g basic zinc carbonate (1.2 mmol), 2.8 g oleic acid, 5 g ODE were weighed and placed in a 100 mL three-necked flask, purged with inert gas for 30 minutes, and then heated to 280° C. to obtain a clear solution. The purified CdSe/CdZnSe/ZnSe core-shell quantum dots were injected, the temperature was raised to 300° C., and a mixed solution of 2 mL of 0.5 mmol/mL S-TBP and 0.05 mL of 0.2 mmol/mL cadmium oleate were dropwise added at a rate of 5 mL/h. Then 2 mL of 0.5 mmol/mL S-TBP solution was dropwise added at the same rate, and the reaction was stopped after the addition was complete.

Embodiment 1

The manufacturing process of light emitting device includes:

Step 1, Making a Quantum Dot Film:

The adhesive of a first water-oxygen barrier layer, the adhesive of a first thermally conductive layer, the adhesive of a light conversion layer, the adhesive of a second thermally conductive layer, the adhesive of a second water-oxygen barrier layer, and a second release film were coated successively on a first release film, and then cured.

The light conversion layer included a mixture of red quantum dots, green quantum dots and acrylate resin. The red quantum dots were CdS/ZnSe core-shell quantum dots with a emission peak wavelength of 630 nm, and the green quantum dots were CdS/ZnSe core-shell quantum dots with a emission peak wavelength of 530 nm, while the thickness of the light conversion layer was 20 μm.

The thickness of each of first thermally conductive layers was 20 μm, and the thermally conductive layer included silver nanowires and acrylic monomers. The length of the silver nanowires was 200 μm, and the diameter was 10 μm. In the material of the thermally conductive layer, the weight percentage of the silver nanowires was 10%.

A water-oxygen barrier layer was disposed on the surface of each of thermally conductive layers far away from the quantum dots. The thickness of each of water-oxygen barrier layers was 20 μm. The water-oxygen barrier layer included a water barrier layer and an oxygen barrier layer that were sequentially stacked, and the water barrier layer and the thermally conductive layer were disposed in contact, while the water barrier layer was a polyvinylidene chloride coating, and the material of the aforesaid oxygen barrier layer included a polyvinyl alcohol coating.

The two release films of the quantum dot film were peeled off and cut into a plurality of quantum dot sub-films with a size same as that of the LED chip using a cutting machine for further use.

Step 2, Providing a LED Unit:

A precision dispenser was used to dispense adhesive onto the circuit-arranged substrate to install three LED chips provided spaced apart, and the LED chips were blue-emissive LED chips.

Step 3, the adhesive of a first transparent adhesive layer was disposed on the exposed surface of each of the aforesaid LED chips, and the adhesive was silicone.

Step 4, the aforesaid quantum dot sub-films was disposed on the surface of the adhesive of the aforesaid first transparent adhesive layer far away from each of the aforesaid LED chips with one-to-one correspondence, and the bonding of the first transparent adhesive layer and the quantum dot sub-films was realized after curing.

Step 5, a second transparent adhesive layer was disposed on the exposed surface of the aforesaid quantum dot sub-films, the thickness of the second transparent adhesive layer was 50 μm, and the material of the second transparent adhesive layer was modified silicone.

The schematic diagram of the light emitting device obtained is shown in FIG. 4.

Embodiment 2

The manufacturing process of light emitting device includes:

Step 1, making a quantum dot film:

The adhesive of a first water-oxygen barrier layer, the adhesive of a first thermally conductive layer, the adhesive of a light conversion layer, the adhesive of a second thermally conductive layer, the adhesive of a second water-oxygen barrier layer, and a second release film were successively coated on a first release film, and then cured.

The light conversion layer included a mixture of red quantum dots, green quantum dots and acrylate resin. The red quantum dots were CdS/ZnSe core-shell quantum dots with a emission peak wavelength of 630 nm, and the green quantum dots were CdS/ZnSe core-shell quantum dots with a emission peak wavelength of 530 nm, while the thickness of the light conversion layer was 20 μm.

The thickness of each of first thermally conductive layers was 20 µm, and the thermally conductive layer included silver nanowires and acrylic acid. The length of the silver nanowires was 200 µm, and the diameter was 10 µm. In the material of the thermally conductive layer, the weight percentage of the silver nanowires was 10%.

A water-oxygen barrier layer was disposed on the surface of each of thermally conductive layers far away from the quantum dots. The thickness of each of water-oxygen barrier layers was 20 µm. The water-oxygen barrier layer included a water barrier layer and an oxygen barrier layer that were sequentially stacked, and the water barrier layer and the thermally conductive layer was disposed in contact, while the water barrier layer was a polyvinylidene chloride coating, and the material of the aforesaid oxygen barrier layer included a polyvinyl alcohol coating.

The two release films of the quantum dot film were peeled off, and the quantum dot film had a size as same as that of the LED wafer to be processed and was ready for further use.

Step 2, Providing a LED Unit:

A LED wafer with the material and structure same as those of the LED chip of Embodiment 1 was prepared.

Step 3, the adhesive of a first transparent adhesive layer was coated on the exposed surface of the LED wafer, and the adhesive was silicone.

Step 4, the aforesaid quantum dot film was correspondingly disposed on the surface of the adhesive of the aforesaid first transparent adhesive layer far away from the LED wafer, the bonding of the first transparent adhesive layer after curing and the quantum dot film was realized and a LED luminous body with quantum dot film was obtained.

Step 5, a wafer laser cutting machine was used to cut the LED luminous body with quantum dot film to obtain small light emitting devices.

Step 6, small light emitting devices were placed onto the circuit-arranged substrate.

Step 7, a second transparent adhesive layer was disposed on the exposed surface of the small light emitting devices, the thickness of the second transparent adhesive layer was 50 µm, and the material of the second transparent adhesive layer was modified silicone.

The schematic diagram of the light emitting device obtained is shown in FIG. 4.

Embodiment 3

The difference from Embodiment 1 was that the CdSe/CdZnSe/ZnSe/CdZnS/ZnS core-shell quantum dots with emission peak wavelengths of 630 nm and 530 nm prepared by the aforesaid method.

Comparative Embodiment 1

The quantum dot adhesive was formed. The quantum dot adhesive included a mixture of red quantum dots, green quantum dots and acrylate resin (the formula of quantum dot adhesive was the same as that in Embodiment 1), and the quantum dot adhesive was directly injected onto the LED chips in multiple batches for curing. After being injected onto the LED chip for each time, all were cured, and the quantum dot adhesive injected next was actually disposed on the cured quantum dot material layer.

The LED chip was lighted in an oven at 50° C. and the optical performance changes were monitored to test the reliability of the light emitting devices of the embodiments and the comparative embodiment to characterize the stability of the light emitting devices; the chromaticity coordinates of the light emitting devices of the embodiments and the comparative embodiment were tested by the duplicate sample integrating sphere method to characterize the luminous uniformity of the light emitting devices. X1, X2, and X3 represented the X coordinates of the light emitting devices of the three quantum dot LEDs, and Y1, Y2, and Y3 represented the Y coordinates of the light emitting devices of the three quantum dot LEDs. Light emitting device used here referred to 3 LED chips with quantum dot film made in the same batch.

The specific test results are shown in Table 1.

TABLE 1

|  | Initial luminous efficiency (%) | Luminous efficiency after lighting in oven at 50° C. for 500 h (%) | CIE (X1) | CIE (Y1) | CIE (X2) | CIE (Y2) | CIE (X3) | CIE (Y3) |
| --- | --- | --- | --- | --- | --- | --- | --- | --- |
| Embodiment 1 | 61% | 57.5% | 0.285 | 0.295 | 0.281 | 0.297 | 0.282 | 0.293 |
| Embodiment 2 | 60.5% | 56.5% | 0.282 | 0.299 | 0.283 | 0.291 | 0.28 | 0.293 |
| Embodiment 3 | 66.8% | 65.2% | 0.281 | 0.292 | 0.282 | 0.292 | 0.281 | 0.291 |
| Comparative Embodiment 1 | 65.5% | 48.5% | 0.28 | 0.29 | 0.26 | 0.25 | 0.30 | 0.28 |

It can be seen from Table 1 that the XY color coordinate deviation of the three small light emitting devices of the embodiments was relatively small, while the XY color coordinate deviation of the Comparative Embodiment 1 was relatively large; and the luminous efficiency after lighting in oven at 50° C. for 500 h of the embodiment was significantly higher than that of the comparative embodiment. Embodiment 3 had the highest luminous efficiency due to use of quantum dots with better stability.

From the above description, it can be seen that the aforesaid embodiments of this disclosure may achieve the following technical effects:

1) In the manufacturing process of this disclosure, a quantum dot film is first made, because the distribution of the quantum dot material in the quantum dot film can be more uniform, so that the light emitting device obtained by this process has a more uniform quantum dot material distribution and the luminous uniformity of the LED is improved.

2) By introducing a peelable substrate layer, thinning of the light emitting device can be achieved.

3) The introduction of high-stability quantum dots is also conducive to the thinning of the light emitting device.

4) Cutting the quantum dot film and the LED wafer at the same time can improve production efficiency.

The foregoing descriptions are merely preferred embodiments of the present disclosure and are not intended to limit the present disclosure, and for those skilled in the art, the present disclosure may have various changes and modifications. Any modification, equivalent replacement, and improvement made in the spirit and principle of the present disclosure shall fall within the protection scope of the present disclosure.

What is claimed is:

1. A manufacturing process of a light emitting device, comprising:
    step S1, making a quantum dot film;
    step S2, providing a LED unit, the LED unit comprising at least one LED chip;
    step S3, disposing a first transparent adhesive layer on an exposed surface of the at least one LED chip;
    step S4, disposing the quantum dot film on a surface of the first transparent adhesive layer far away from the at least one LED chip,
    wherein the step S1 comprises:
    step S11, providing a substrate layer;
    step S12, disposing a first water-oxygen bather layer on a surface of the substrate layer;
    step S13, disposing a light conversion layer on a surface of the first water-oxygen barrier layer far away from the substrate layer, and the light conversion layer comprising a quantum dot material;
    step S14, disposing a second water-oxygen barrier layer on a surface of the light conversion layer far away from the substrate layer,
    wherein the step S1 further comprises:
    disposing a thermally conductive layer on at least one surface of the light conversion layer,
    wherein a material of the thermally conductive layer comprises a thermally conductive material and a binder.

2. The manufacturing process according to claim 1, wherein the substrate layer is a peelable substrate layer.

3. The manufacturing process according to claim 2, after the step S14, the step S1 further comprising: peeling off the substrate layer.

4. The manufacturing process according to claim 1, wherein the first transparent adhesive layer is in an uncured state, and after the step S4, the manufacturing process further comprising: curing the first transparent adhesive layer to realize the bonding between the quantum dot film and the first transparent adhesive layer, and preferably, a surface of the first transparent adhesive layer close to the quantum dot film is flat.

5. The manufacturing process according to claim 1, wherein the step S3 comprises:
    disposing a first transparent adhesive on an exposed surface of the at least one LED chip;
    curing the first transparent adhesive to form the first transparent adhesive layer,
    preferably, disposing the quantum dot film on a surface of the first transparent adhesive layer by a binder.

6. The manufacturing process according to claim 1, wherein after the step S4, the manufacturing process further comprises:
    S5, disposing a second transparent adhesive layer on an exposed surface of the quantum dot film.

7. The manufacturing process according to claim 1, wherein the step S1 comprises: sectioning the quantum dot film into a plurality of quantum dot sub-films; the step S4 comprising: disposing each of the plurality of quantum dot sub-films on the surface of the first transparent adhesive layer far away from the at least one LED chip, so that a projection of each of the plurality of quantum dot sub-films on a first plane covers a projection of the at least one LED chip on the first plane with one-to-one correspondence, the first plane is a plane perpendicular to a thickness direction of the first transparent adhesive layer,
    preferably, the projection of each of the plurality of quantum dot sub-films on the first plane has the same size and shape as the projection of the at least one LED chip on the first plane.

8. The manufacturing process according to claim 1, wherein the LED unit further comprises a substrate, and the at least one LED chip is disposed on a surface of the substrate.

9. The manufacturing process according to claim 1, wherein sectioning the structure formed through the step S4 comprises the LED unit, the quantum dot film, and the first transparent adhesive layer.

10. The manufacturing process according to claim 1, wherein the step S1 further comprises at least one of the following:
    after the step S13, disposing a thermally conductive layer on at least one surface of the light conversion layer;
    between the step S11 and the step S13, disposing a thermally conductive layer on at least one surface of the light conversion layer;
    after the step S13, and between the step S11 and the step S13, disposing a thermally conductive layer on at least one surface of the light conversion layer.

11. A light emitting device, comprising:
    a LED unit, comprising at least one LED chip;
    a first transparent adhesive layer, disposed on a surface of the at least one LED chip;
    a quantum dot film, disposed on a surface of the first transparent adhesive layer far away from the at least one LED chip,
    wherein the quantum dot film comprises:
    a light conversion layer, the light conversion layer comprising a quantum dot material;
    a thermally conductive layer disposed on at least one surface of the light conversion layer;
    two water-oxygen barrier layers, disposed on two opposite surfaces of the light conversion layer, respectively as a first water-oxygen barrier layer and a second water-oxygen barrier layer,
    wherein a material of the thermally conductive layer comprises a thermally conductive material and a binder.

12. The light emitting device according to claim 11, wherein the quantum dot film comprises a plurality of quantum dot sub-films, and a projection of the plurality of quantum dot sub-film on a first plane covers a projection of the at least one LED chip on the first plane with one-to-one correspondence, and the first plane is a plane perpendicular to a thickness direction of the first transparent adhesive layer.

13. The light emitting device according to claim 11, wherein the thermally conductive material comprises at least one of thermally conductive metal, glass powder, ceramic powder, graphite, and carbon powder, and more preferably, the thermally conductive material comprises at least one of nano-copper and silver nanowire.

14. The light emitting device according to claim 13, wherein the thermally conductive material comprises the silver nanowire, the silver nanowire has a length of 10~500 μm and a diameter of 30 nm~20 μm.

15. The light emitting device according to claim 11, wherein the two water-oxygen barrier layers both comprises a water barrier layer and an oxygen barrier layer that are sequentially stacked, and a material of the water barrier layer comprises at least one of epoxy resin, polyvinylidene chloride, polyvinylidene fluoride and nano-sized ZnO particles, and a material of the oxygen barrier layer comprises at least one of polyvinyl alcohol, ethylene-vinyl alcohol copolymer and ethylene-vinyl acetate copolymer, wherein, the oxygen barrier layer is disposed on a side close to the light conversion layer.

16. The light emitting device according to claim 11, wherein the light emitting device further comprises:
   a second transparent adhesive layer disposed on a surface of the quantum dot film far away from the first transparent adhesive layer.

17. A photoelectric device, wherein the photoelectric device comprises the light emitting device according to claim 11.

18. The light emitting device according to claim 12, wherein the projection of each of the plurality of quantum dot sub-films on the first plane has a same size and a shape as the projection of the at least one LED chip on the first plane.

* * * * *